(12) United States Patent  
Ozeki et al.

(10) Patent No.: US 9,182,151 B2  
(45) Date of Patent: Nov. 10, 2015

(54) SOLAR POWER GENERATION APPARATUS

(75) Inventors: Syu-u Ozeki, Mito (JP); Yuji Hamachi, Mito (JP)

(73) Assignee: EIKOU CO., LTD, Mito-shi (JP)

( * ) Notice: Subject to any disclaimer, the term of this patent is extended or adjusted under 35 U.S.C. 154(b) by 182 days.

(21) Appl. No.: 13/541,046

(22) Filed: Jul. 3, 2012

(65) Prior Publication Data

US 2012/0266941 A1 Oct. 25, 2012

(30) Foreign Application Priority Data

Jan. 27, 2010 (JP) ................................ 2010-015329  
Jul. 4, 2011 (JP) ................................ 2011-148097

(51) Int. Cl.
*H01L 31/054* (2014.01)  
*F24J 2/52* (2006.01)  
*F24J 2/54* (2006.01)  
*H01L 31/042* (2014.01)

(52) U.S. Cl.
CPC ............... *F24J 2/5233* (2013.01); *F24J 2/541* (2013.01); *H01L 31/0547* (2014.12); *H02S 20/00* (2013.01); *F24J 2002/5468* (2013.01); *Y02E 10/47* (2013.01); *Y02E 10/52* (2013.01)

(58) Field of Classification Search
CPC ............... H01L 31/00; H01L 31/0232; H01L 31/02325; H01L 31/052; H01L 31/0522; H01L 31/0525; H01L 31/042; H01L 31/0422; H01L 31/02; H01L 31/02327; H01L 31/0352; H01L 31/04; H01L 31/054; H01L 31/0547; H02S 20/00; H02S 20/10; H02S 20/20; H02S 20/30; H02S 20/32; H02S 40/22  
USPC ................................................... 136/246, 259  
See application file for complete search history.

(56) References Cited

U.S. PATENT DOCUMENTS

| | | | | | |
|---|---|---|---|---|---|
| 3,990,914 | A | * | 11/1976 | Weinstein et al. | 136/246 |
| 4,078,944 | A | * | 3/1978 | Mlavsky | 136/246 |
| 4,469,938 | A | * | 9/1984 | Cohen | 250/203.4 |
| 5,058,565 | A | * | 10/1991 | Gee et al. | 126/570 |
| 6,201,181 | B1 | * | 3/2001 | Azzam et al. | 136/244 |
| 2001/0008144 | A1 | | 7/2001 | Uematsyu et al. | |
| 2004/0055594 | A1 | * | 3/2004 | Hochberg et al. | 126/696 |
| 2010/0206357 | A1 | * | 8/2010 | Littau et al. | 136/246 |

FOREIGN PATENT DOCUMENTS

| | | |
|---|---|---|
| JP | 51-065667 U | 5/1976 |
| JP | 11-243225 A | 9/1999 |
| JP | 2001-217450 A | 8/2001 |
| JP | 2006-019670 A | 1/2006 |
| JP | 3150472 U | 4/2009 |
| JP | 2009-231315 | 8/2009 |
| JP | 2009-231315 A | 10/2009 |

* cited by examiner

*Primary Examiner* — Christina Chern  
(74) *Attorney, Agent, or Firm* — Sughrue Mion, PLLC

(57) ABSTRACT

A solar power generation apparatus includes a solar cell panel body formed in a tube shape, and a reflection plate installed such that reflected light is incident to the solar cell panel body, wherein the solar cell panel body can be rotated around a shaft center of the tube shape.

5 Claims, 15 Drawing Sheets

SOLAR POWER GENERATION APPARATUS

CROSS REFERENCE TO RELATED APPLICATION

Japanese patent application laid-open No. JP 2011-155115 A published on Aug. 11, 2011, the content of which is hereby incorporated by reference into this application.

BACKGROUND OF THE INVENTION

1. Field of the Invention

The present invention relates to a solar power generation apparatus.

2. Description of the Related Art

FIG. 7 shows a solar power generation apparatus in the related art disclosed in JP2009-231315A. The solar power generation apparatus includes a solar cell panel body 101 formed in a spherical shape and a curved reflection plate 102, and can receive not only the sunlight which is directly incident to the solar cell panel body but also the sunlight reflected by the reflection plate on the rear surface side of the solar cell panel body.

In solar cell panels of the solar power generation apparatus disclosed in JP2009-231315A, a range to which the sunlight is directly incident easily deteriorates as compared with a range to which the sunlight is not directly incident, thus an efficiency of power generation by direct incidence will be reduced.

In addition, in the solar cell panels of the solar power generation apparatus disclosed in JP2009-231315A, a range which receives the sunlight reflected by the reflection plate is restricted, and thus it cannot be said that the sunlight is sufficiently used.

SUMMARY OF THE INVENTION

An object of the present invention is to make deterioration in solar cells uniform and to sufficiently use the sunlight in a solar power generation apparatus using a solar cell panel body and a reflection plate.

According to a first aspect of the present invention, there is provided a solar power generation apparatus including a solar cell panel body that includes a plurality of solar cell panels disposed in a tube shape; a reflection plate that is disposed such that reflected light is incident to the solar cell panels; a strut around which the solar cell panel body is installed so as to be rotated; and a base on which the strut is erected, wherein the solar cell panel body can be rotated around an axis of the tube shape.

According to a second aspect of the present invention, the reflection plate is installed so as to be revolved around the solar cell panel body.

According to a third aspect of the present invention, the solar cell panel body and the reflection plate can be rotated in an upper surface direction of the base.

According to a fourth aspect of the present invention, the solar power generation apparatus further includes a sun position detecting means for detecting a position of the sun; a rotation driving means for rotating the solar cell panel body and the reflection plate in an upper surface direction of the base; and a revolution driving means for revolving the reflection plate around the solar cell panel body, wherein the rotation driving means and the revolution driving means, and the sun position detecting means can communicate with each other, the solar cell panel body and the reflection plate are revolved depending on an azimuth of the sun detected by the sun position detecting means, and the reflection plate is revolved depending on an altitude of the sun detected by the sun position detecting means.

According to a fifth aspect of the present invention, the solar power generation apparatus further includes a condensing lens that collects the sunlight at the solar cell panel body; and a rotating driving means for continually rotating the solar cell panel body around an axis of the tube shape in one direction.

According to a sixth aspect of the present invention, the condensing lens is installed so as to be moved relatively with respect to the solar cell panel body, so that a position and a range of the collected sunlight are adjusted.

According to a seventh aspect of the present invention, the base includes a traveling means.

According to an eighth aspect of the present invention, there is provided a solar power generation apparatus including a solar cell panel body that includes plural solar cell panels disposed in an approximately tube shape, in a polyhedral shell shape, in an approximately spherical shell shape, or in an approximately spheroidal shell shape; and a reflection plate that includes an inner surface with a groove-shaped or hollow-shaped curved surface as a reflection surface and is installed such that reflected light is incident to the solar cell panels, wherein the solar cell panel body is disposed such that 80% or more of light receiving surfaces of the solar cell panel body are located inside a groove formed by the groove-shaped curved surface or inside a hollow formed by the hollow-shaped curved surface.

According to a ninth aspect of the present invention, the solar cell panel body has an approximately tube shape and is disposed in a manner that its tube axis may be vertical, and wherein a transverse cross-section of the reflection plate has a curved plate shape of an arched shape and can be rotated along a trajectory which circles around the solar cell panel body in a horizontal direction.

According to a tenth aspect of the present invention, the solar power generation apparatus further includes a sun position detecting means for detecting a position of the sun; and a rotation driving means for rotating the reflection plate around the solar cell panel body, wherein the sun position detecting means and the rotation driving means can communicate with each other, and the reflection plate is rotated depending on an azimuth of the sun detected by the sun position detecting means.

According to an eleventh aspect of the present invention, the reflection plate has a bowl shape which is open upwardly, and the solar cell panel body has a polyhedral shell shape, an approximately spherical shell shape, or an approximately spheroidal shell shape and is disposed above the bottom of the reflection plate.

According to a twelfth aspect of the present invention, the reflection plate has a bowl shape which is open upwardly, and the solar cell panel body has an approximately tube shape, is disposed in a manner that its tube axis may be vertical, and is disposed above the bottom of the reflection plate.

According to the solar power generation apparatus of the first aspect, the solar cell panels are formed in the tube shape, the sunlight is reflected by the reflection plate, and thereby it is possible to generate power by irradiating the solar cell panels to which the sunlight is not directly incident with reflected light. In addition, it is possible to reduce an installation area of the solar cell panels. Further, the solar cell panel body is rotated around the axis of the tube shape, and thereby it is possible to prevent the sunlight from being continuously directly incident only to some of the solar cell panels and to thereby uniformly adjust deterioration in the solar cell panels.

According to the solar power generation apparatus of the second aspect, since the reflection plate can be revolved around the solar cell panel body, an inclination angle of the reflection plate can be adjusted depending on an altitude of the sun. Therefore, it is possible to reflect the sunlight and perform solar power generation with high efficiency.

According to the solar power generation apparatus of the third aspect, since the solar cell panel body and the reflection plate can be rotated so as to face the sun, it is possible to perform solar power generation with high efficiency.

According to the solar power generation apparatus of the fourth aspect, which includes the sun position detecting means for detecting the position of the sun, the rotation driving means rotates the solar cell panel body and the reflection plate depending on the detected azimuth of the sun, and the revolution driving means can revolve the reflection plate depending on the detected altitude of the sun, thereby it is possible to perform solar power generation with high efficiency.

According to the solar power generation apparatus of the fifth aspect, since the sunlight can be collected at the solar cell panel body using the condensing lens, power generation is efficiently performed even with a small area. For this reason, it is possible to reduce the size of the solar cell panels. Further, since the solar cell panel body can be continuously rotated by the rotating driving means, it is possible to prevent the solar cell panels from being burnt out due to the sunlight collected by the condensing lens.

According to the solar power generation apparatus of the sixth aspect, since the condensing lens can be moved relatively with respect to the solar cell panel body, it is possible to adjust a condensing range of the sunlight depending on the position and the altitude of the sun and the size of the solar cell panel and to thereby perform solar power generation with high efficiency.

According to the solar power generation apparatus of the seventh aspect, the base is provided with the traveling means, and the base can be moved to any position so as to perform solar power generation.

According to the solar power generation apparatus of the eighth aspect, the sunlight is directly received and is reflected by the reflection plate, and thereby power can be generated by irradiating the solar cell panels to which the sunlight is not directly incident with reflected light. In addition, the area of the light receiving surfaces of the solar cell panel body receiving the sunlight reflected by the reflection plate is increased to 50% or more of a total of the light receiving surfaces, and thereby a power generation amount is increased.

According to the solar power generation apparatus of the ninth aspect, since the reflection plate can be rotated around the solar cell panel body, it is possible to adjust an orientation of the reflection plate depending on a horizontal azimuth of the sun. Therefore, it is possible to perform solar power generation by directly receiving the sunlight and reflecting the sunlight with higher efficiency.

According to the solar power generation apparatus of the tenth aspect, which includes the sun position detecting means for detecting the position of the sun, since the rotation driving means can rotate the reflection plate depending on a detected horizontal azimuth of the sun, it is possible to perform solar power generation with high efficiency.

According to the solar power generation apparatus of the eleventh aspect, the sunlight can be directly received, and the sunlight can be collected at the solar cell panel body according to a reflection lens effect. In addition, since the area of the light receiving surfaces of the solar cell panel body which receive the sunlight reflected by the reflection plate can be increased to 50% or more, a power generation amount is increased.

According to the solar power generation apparatus of the twelfth aspect, the sunlight can be directly received, and the sunlight can be collected at the solar cell panel body according to a reflection lens effect. In addition, since the area of the light receiving surfaces of the solar cell panel body which receive the sunlight reflected by the reflection plate can be increased to 50% or more of a total of the light receiving surfaces, a power generation amount is increased.

DETAILED DESCRIPTION OF THE INVENTION

Figure 1:
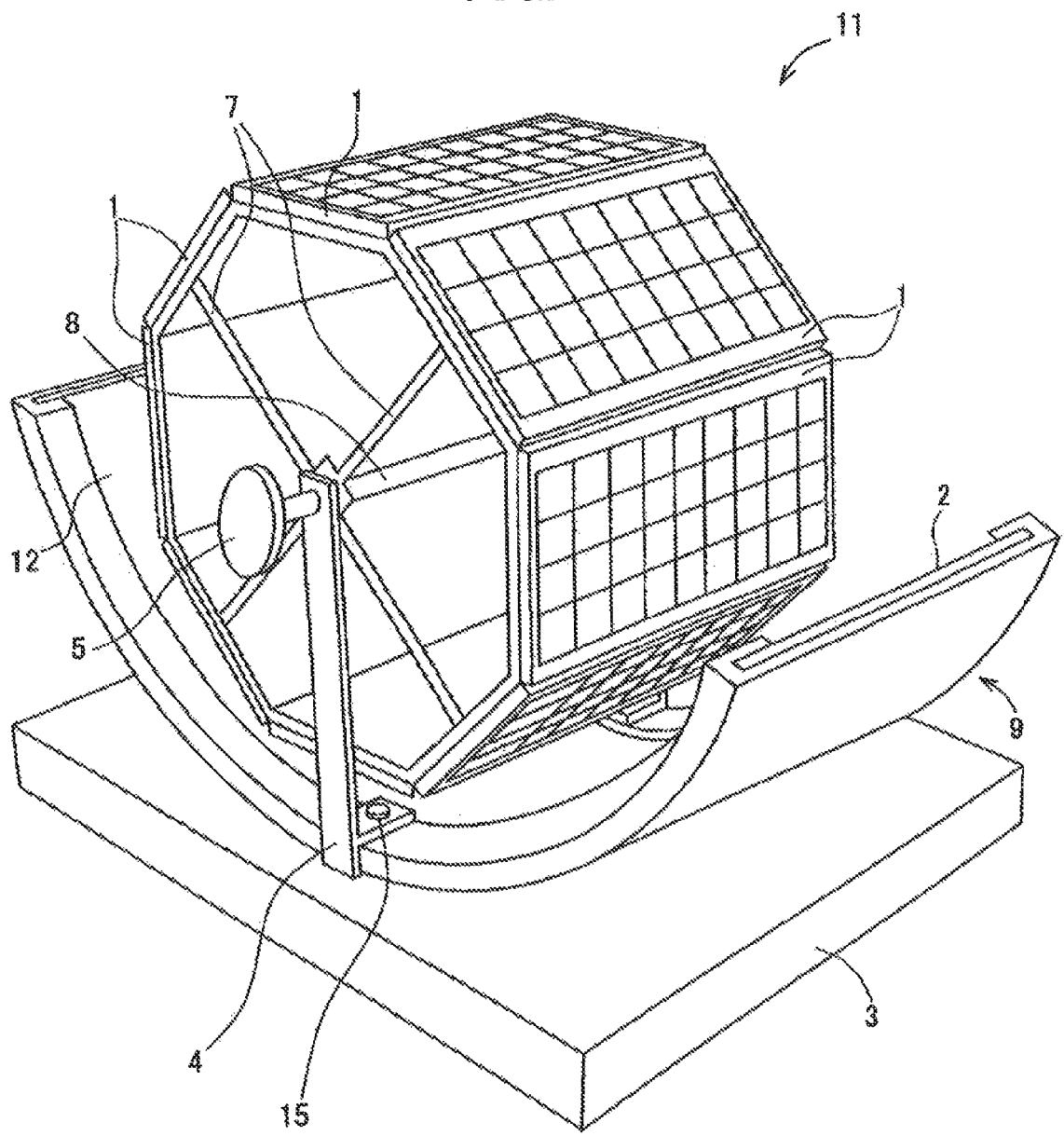
FIG. 1 is a perspective view illustrating a solar power generation apparatus according to a first embodiment of the present invention.

FIG. 1 shows a solar power generation apparatus according to a first embodiment of the present invention, and the solar power generation apparatus includes solar cell panels 1, a curved mirror 2, a rotation shaft 8, a handle 5, a base 3, and struts 4 vertically erected from the base 3.

The solar cell panel 1 is in a panel shape where plural solar cells which are power devices directly converting light energy into power using a photovoltaic effect are connected in series and in parallel and thereby necessary voltage and current can be obtained. A solar cell panel body 11 is obtained by disposing the solar cell panels 1 in an octagonal prism shape. The solar cell panel body 11 may be obtained by disposing the solar cell panels 1 in a polygonal prism shape or a cylindrical shape other than the octagonal prism shape.

The curved mirror 2 is a reflection plate which reflects the sunlight using a reflection surface 12, and the reflection surface 12 is formed to be concaved. A cross-section of the concaved surface has any curved shape, and may have a parabolic shape, an elliptical shape, or any polygonal line shape (hyperbolic shape, or combination of straight lines) other than the parabolic shape. The curved mirror may be a planar mirror, or a concaved surface mirror which collects light incident in parallel at one point, or may be constituted by a reflection plate where plural small-sized mirrors are arranged. The curved mirror 2 is held by a curved mirror holder 9 such that the periphery and the rear surface thereof are surrounded thereby. The curved mirror 2 is a glass mirror, but may be an acryl mirror, an aluminum mirror or a stainless steel mirror, and preferably has high reflectance.

The handle 5 is a rotation driving means for rotating the solar cell panel body 11 around the rotation shaft 8. The rotation driving means may rotate the solar cell panel body 11 using a motor or using some of power obtained through the solar power generation. In addition, an impeller may be provided at the rotation shaft 8, and the solar cell panel body 11 may be rotated by the force of the wind.

The base 3 has a cuboid shape, and two struts 4 having shaft supporters at front end parts are vertically erected from the base 3. In order to move the solar power generation apparatus, the traveling means such as wheels or caterpillars may be provided at the base 3.

The solar cell panel body 11 has supports 7 provided therein, and the supports 7 are installed at the rotation shaft 8. The rotation shaft 8 is rotatably installed at the shaft supporters provided at the front end parts of the struts 4, and the handle 5 is installed at the front end of the rotation shaft 8. The curved mirror holder 9 is disposed below the solar cell panel body 11 and is fixed to the struts 4 using bolts 15 such that the reflection surface 12 faces the solar cell panel body 11.

The solar power generation apparatus according to the first embodiment performs solar power generation using the sunlight which is directly incident to the solar cell panels 1, and performs solar power generation by irradiating the solar cell panels 1 which are not reached by the direct sunlight with light reflected by the curved mirror 2.

Figure 2:
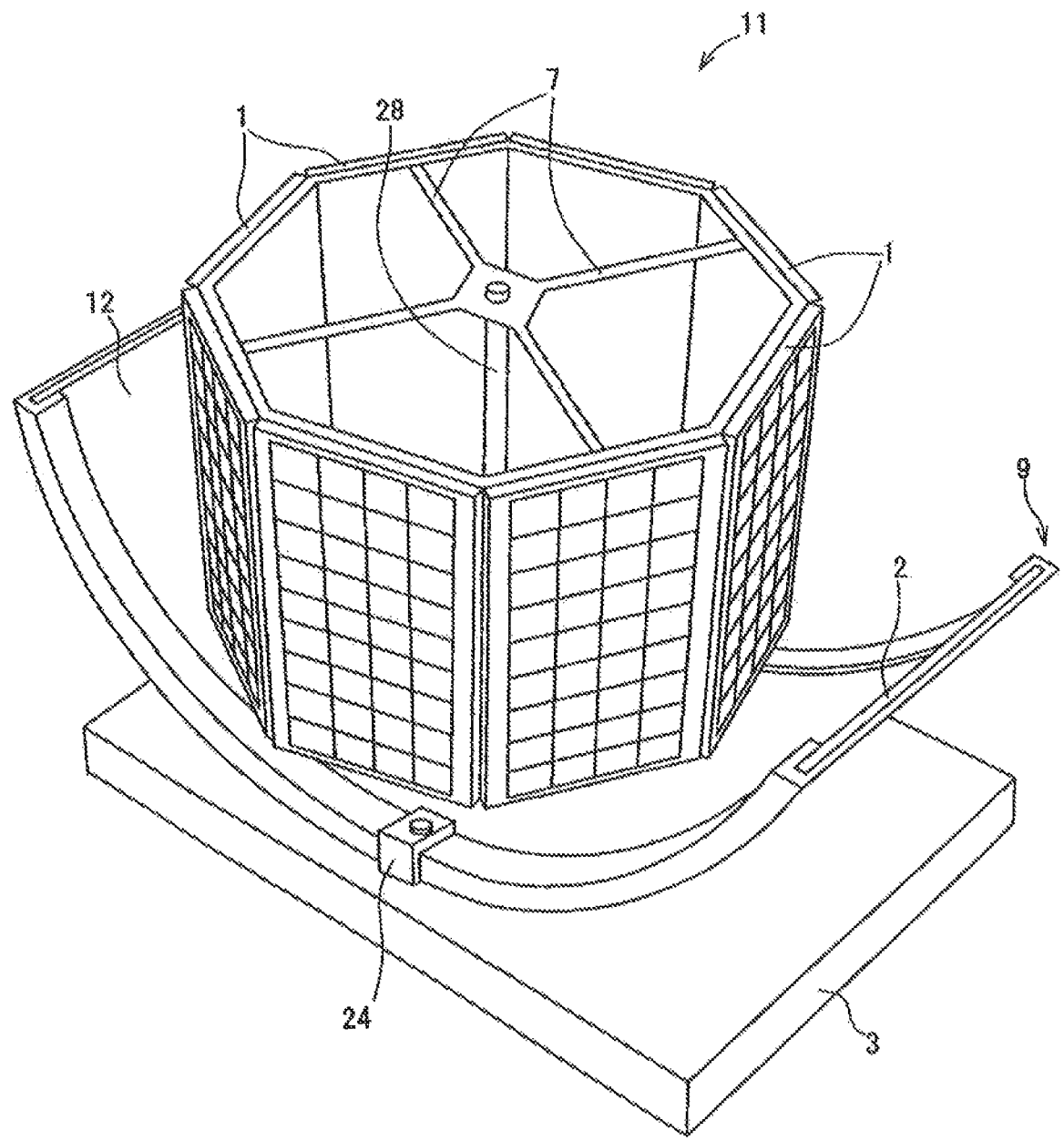
FIG. 2 is a perspective view illustrating a solar power generation apparatus according to a second embodiment of the present invention.

The solar power generation apparatus according to the first embodiment includes the solar cell panels 1 disposed in a tube shape and the curved mirror 2 and thus can generate power by irradiating the solar cell panels 1 which are not reached by the direct sunlight with reflected light. In addition, since the solar cell panels 1 are disposed in a tube shape, it is possible to reduce an installation area of the solar cell panels 1. Since the solar cell panel body 11 is rotated through rotation of the handle 5, the sunlight is prevented from being continuously directly incident only to some of the solar cell panels 1, and thereby it is possible to uniformly adjust deterioration in the solar cell panels 1. The solar cell panel body 11 shown in FIG. 1 may be configured such that, for example, as shown in FIG. 2, the tube shape of the solar cell panel body 11 is installed to be open in a vertical direction. At this time, a rotation shaft 28 is vertically erected from the base 3 and is installed so as to be rotated around an axis. The curved mirror holder 9 and the curved mirror 2 have through-holes (not shown) through which the rotation shaft 28 penetrates.

In the solar power generation apparatus according to the second embodiment, the rotation shaft 28 is installed so as to extend in the vertical direction, and thereby it is possible to pile up plural solar cell panel bodies 11 in the vertical direction. Thereby, it is possible to increase a power generation amount.

Figure 3:
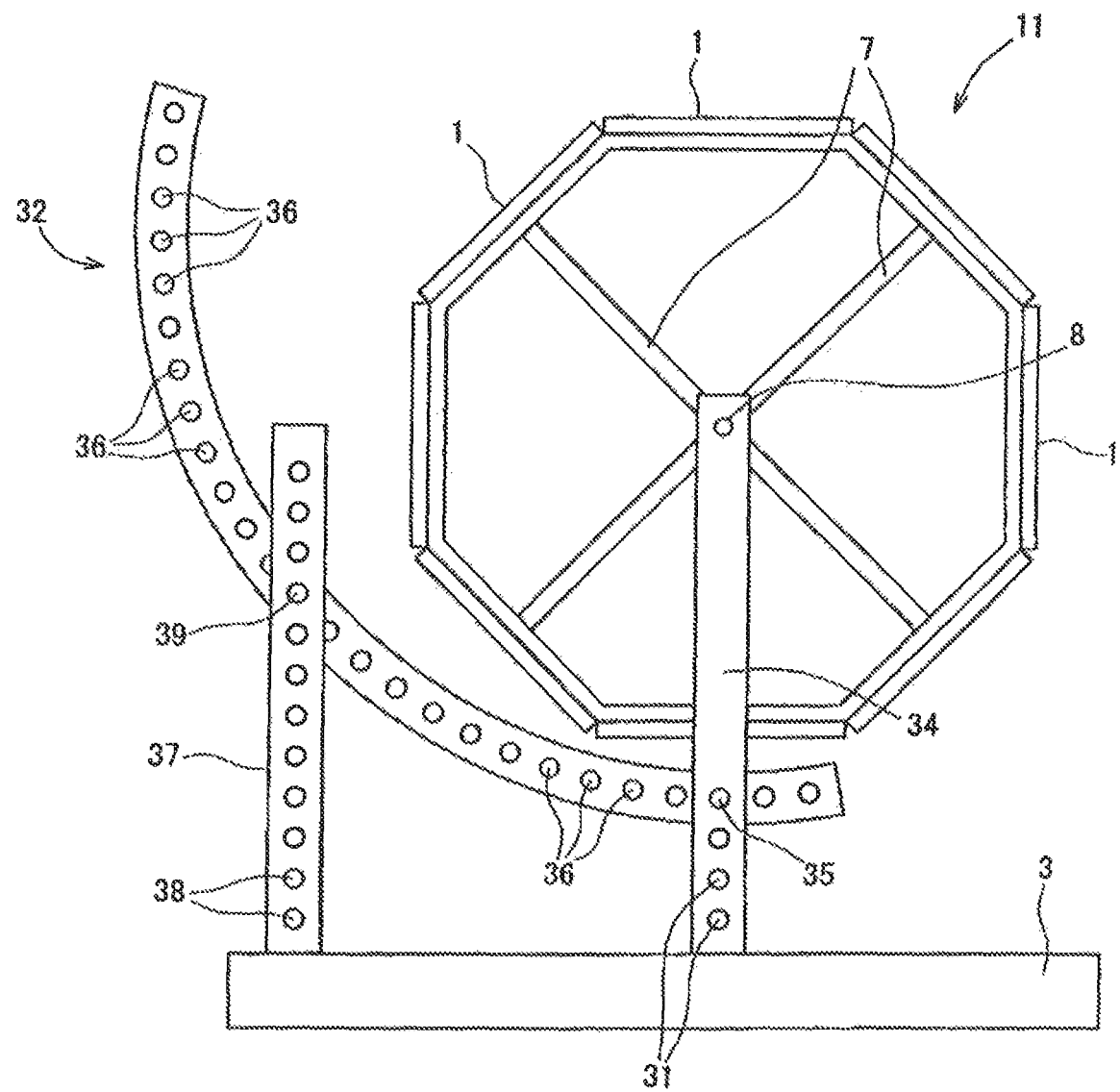
FIG. 3 is a side view illustrating a solar power generation apparatus according to a third embodiment of the present invention.

The installation means of the curved mirror holder 9 shown in FIG. 1 may use, for example, means shown in FIG. 3. A solar power generation apparatus shown in FIG. 3 includes a solar cell panel body 11, a base 3, a cradle 37 vertically erected from the base 3, a strut 34, and a curved mirror holder 32.

The cradle 37 and the strut 34 have a plurality of through-holes (or long holes) in the longitudinal direction, and the curved mirror holder 32 has a plurality of bolt holes 36 on its side surface. The curved mirror holder 32 is installed at the cradle 37 and the strut 34 using bolts. As an installation method thereof, a bolt 39 is screwed into the selected bolt hole 36 of the curved mirror holder 32 via a selected through-hole 38 of the cradle 37, and another bolt 35 is screwed into the selected bolt hole 36 of the curved mirror holder 32 via a selected through-hole 31 of the strut 34.

In the solar power generation apparatus shown in FIG. 3, the through-holes 38 of the cradle 37, the through-holes 31 of the strut 34, and the bolt holes 36 of the curved mirror holder 32 are selected according to the altitude of the sun, thereby adjusting an inclination angle and an installation position of the curved mirror 2. For this reason, it is possible to reflect the sunlight with high efficiency and perform solar power generation.

Figure 4:
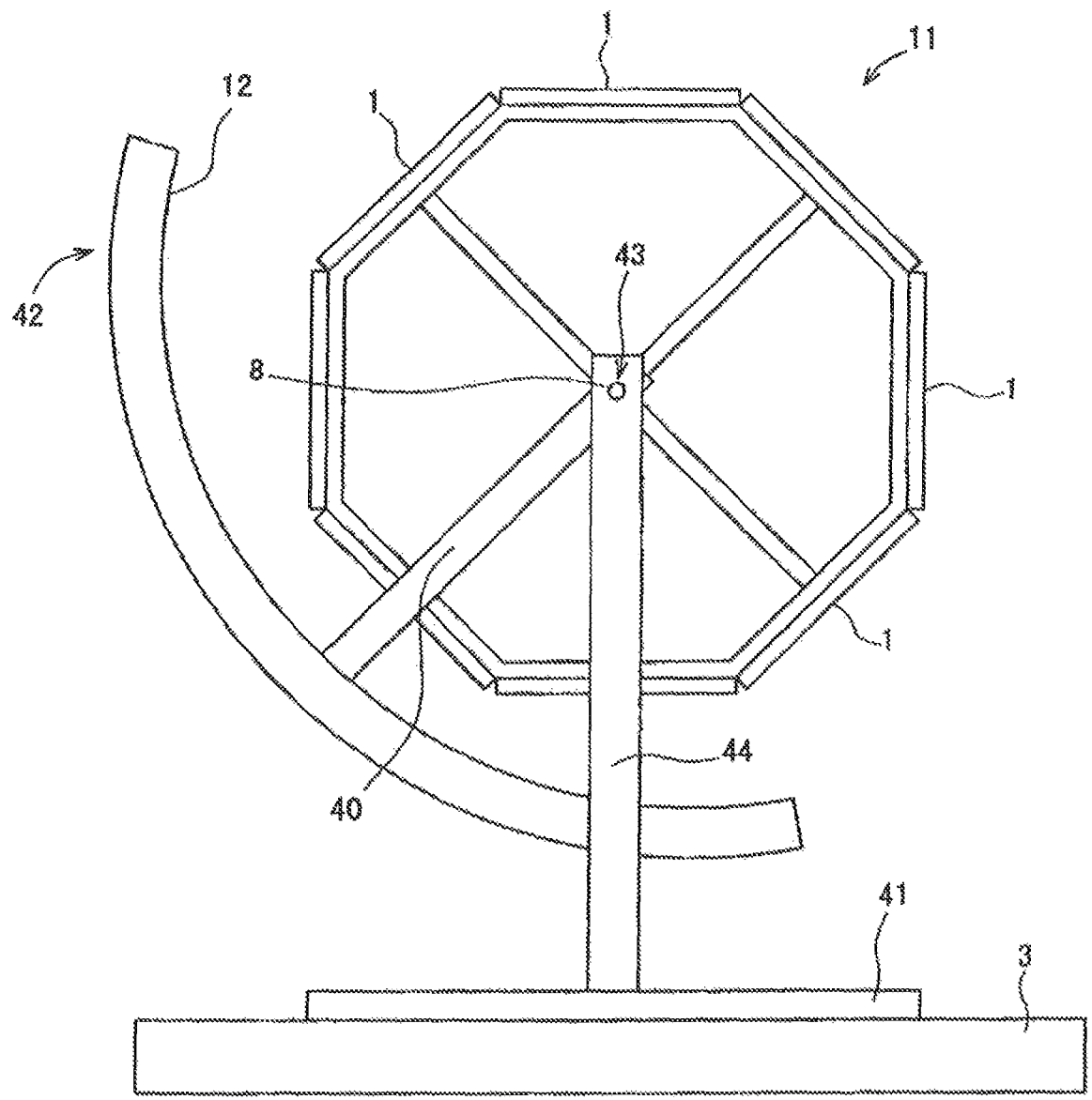
FIG. 4 is a side view illustrating a solar power generation apparatus according to a fourth embodiment of the present invention.

FIG. 4 shows a solar power generation apparatus according to a fourth embodiment which includes a solar cell panel body 11, a curved mirror 2, a rotation shaft 8, a strut 44, a swivel base 41, a sun position detecting means (not shown), an arm revolution driving means (not shown), a swivel base driving means (not shown), and a base 3.

The arm revolution driving means and the swivel base driving means are motors, and a motor such as a stepping motor which can control a rotation angle is preferable. Each driving means is electrically connected to the sun position detecting means so as to communicate with each other, and is operated in response to signals output from the sun position detecting means. The operation may be performed using some of power obtained through solar power generation.

The sun position detecting means includes a photodiode as a sensor, detects the position (azimuth and altitude) of the sun, and outputs a signal indicating the position. When the position of the sun cannot be detected due to the cloudy weather, the position of the sun may be predicted using a predefined calculation formula, the date, and installation place information.

The swivel base 41 is in a disc shape and is installed on the base 3 so as to be rotated in a circumferential direction. The swivel base driving means rotates the swivel base 41 in response to a signal indicating the azimuth output from the sun position detecting means, and is installed in the base 3.

A curved mirror holder 42 includes an arm 40 which is installed so as to extend perpendicularly from a central portion of the side surface thereof. A front end part of the arm 40 is installed at a shaft supporter 43 so as to be rotated around the rotation shaft 8. The arm revolution driving means is installed at the strut 44 so as to revolve the curved mirror holder 42 in response to a signal indicating the altitude output from the sun position detecting means.

The curved mirror 2 is held by the curved mirror holder 42 such that the periphery and the rear surface thereof are surrounded thereby, and a reflection surface 12 is disposed so as to face the solar cell panel body 11. The strut 44 is vertically erected on the rotation plate 41.

In the solar power generation apparatus according to the fourth embodiment, since the sun position detecting means can detect the position of the sun, the swivel base 41 can be rotated such that the solar cell panel body 11 faces the sun in response to a signal from the sun position detecting means, and the curved mirror holder 42 can be rotated such that the reflection surface 12 can face the sun. Therefore, it is possible to perform solar power generation with high efficiency.

Figure 5:
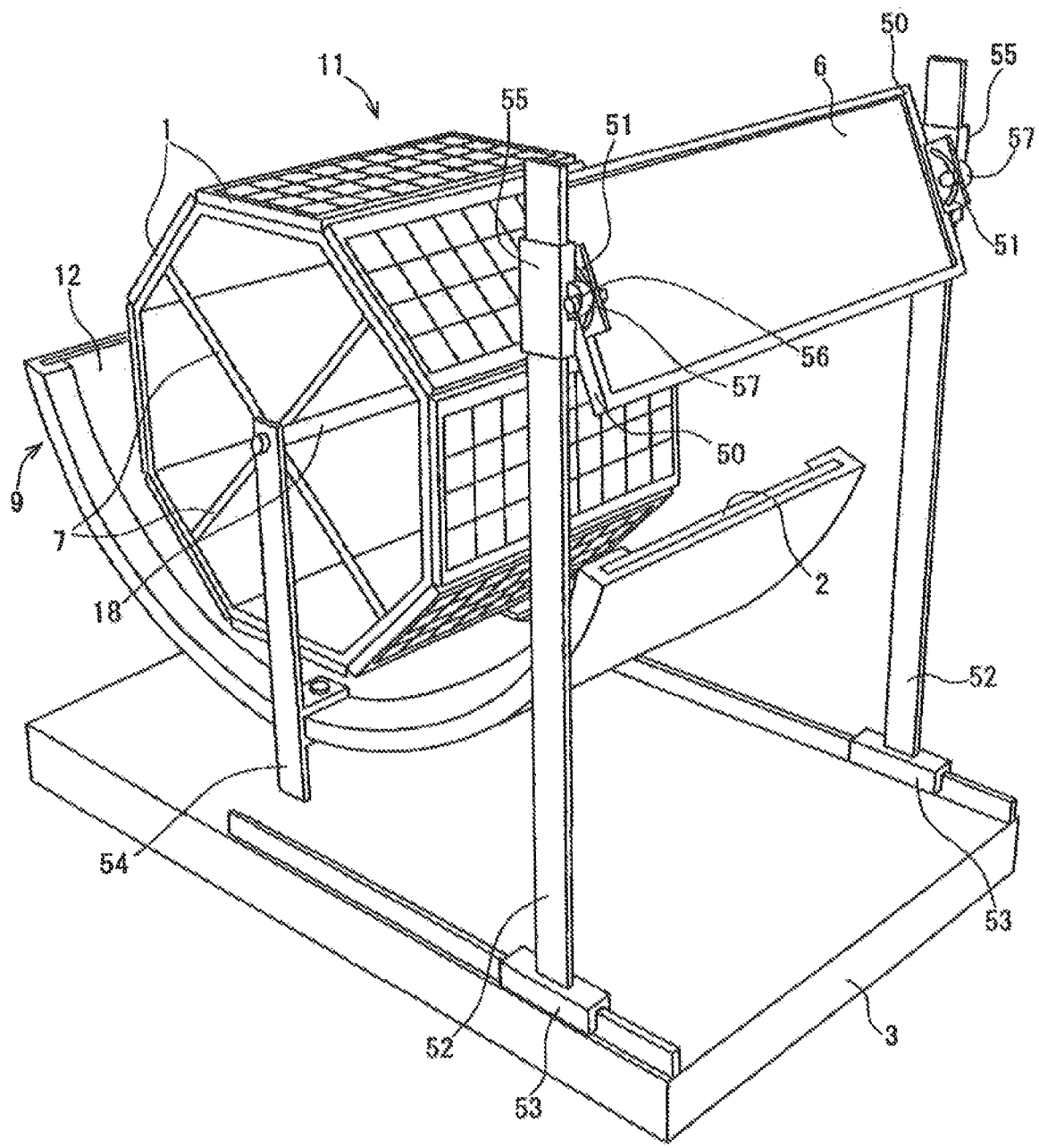
FIG. 5 is a perspective view illustrating a solar power generation apparatus according to a fifth embodiment of the present invention.

FIG. 5 shows a solar power generation apparatus according to a fifth embodiment, and the solar power generation apparatus includes a solar cell panel body 11, a curved mirror 2, a rotation shaft 18, a Fresnel lens 6, cradles 52, a rotating driving means (not shown), first sliders 53 which are installed on a base 3 so as to be movable in front and rear directions with respect to the solar cell panel body 11, and second sliders 55 which are movable in the longitudinal direction of the cradles 52.

The Fresnel lens 6 is used as a condensing lens which collects the sunlight at the solar cell panel body 11. A convex lens whose lens surface may be a spherical surface, or an aspherical surface such as a parabolic surface, an elliptical surface or a hyperbolic surface, may be used, or a cylindrical lens may be used. The Fresnel lens 6 is preferably a plastic lens made of PMMA, an acryl based resin or PC, and may be a lens made of glass such as BK7. In addition, the Fresnel lens 6 collects the incident sunlight in a strip shape but may collect the sunlight in a circular shape. The Fresnel lens 6 is in a rectangular plate shape but may be in a circular plate shape. It is preferable that the area of the plate be large in order to collect the sunlight more. The Fresnel lens 6 is held by a lens frame 50 such that the periphery thereof is surrounded thereby.

The lens frame 50 is rotatably installed at the second sliders 55 and is provided with angle maintaining long holes 51 in order to maintain an inclination angle. Bolts 56 are screwed into bolt holes of protrusions 57 which are formed at the second sliders 55 via the angle maintaining long holes 51, thereby holding the lens frame 50. The cradles 52 are vertically installed at the first sliders 53. The solar cell panel body 11 is installed at struts 54 so as to be rotated around the rotation shaft 18 by the rotating driving means (not shown) which is installed at the struts 54. The rotating driving means is a motor which continuously rotates the solar cell panel body 11 at a constant speed and is operated using some of power obtained through the solar power generation.

In the solar power generation apparatus according to the fifth embodiment, an inclination angle of the lens frame 50 can be adjusted, and thus an incidence angle of the sunlight to the Fresnel lens 6 can be adjusted. In addition, since a distance between the Fresnel lens 6 and the solar cell panel body 11 can be adjusted by the first sliders 53 and the second sliders 55, it is possible to adjust a condensing range of the sunlight depending on a size of a solar cell panel 1 and to thereby perform solar power generation with high efficiency.

Figure 6:
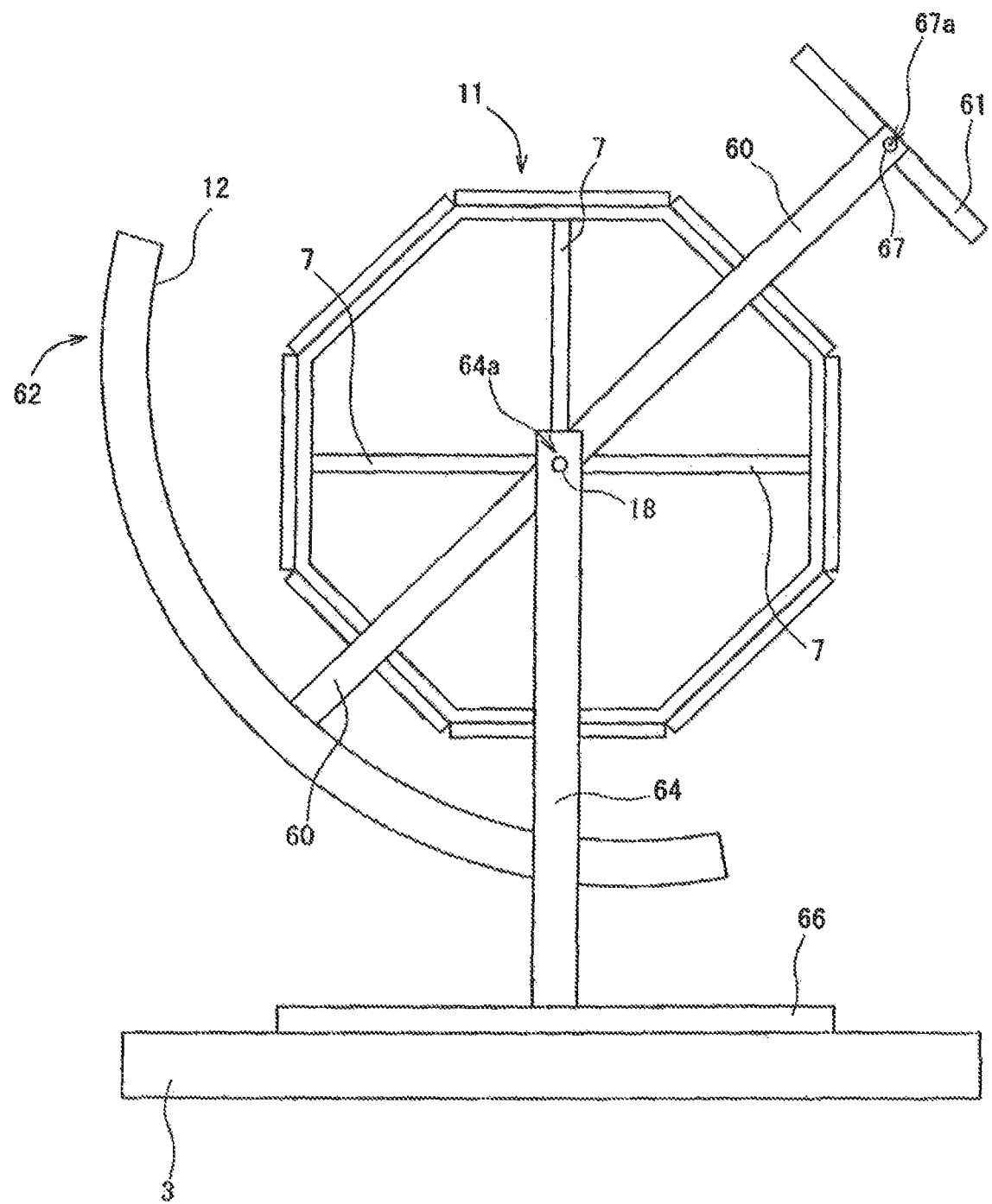
FIG. 6 is a side view illustrating a solar power generation apparatus according to a sixth embodiment of the present invention.
Figure 7:
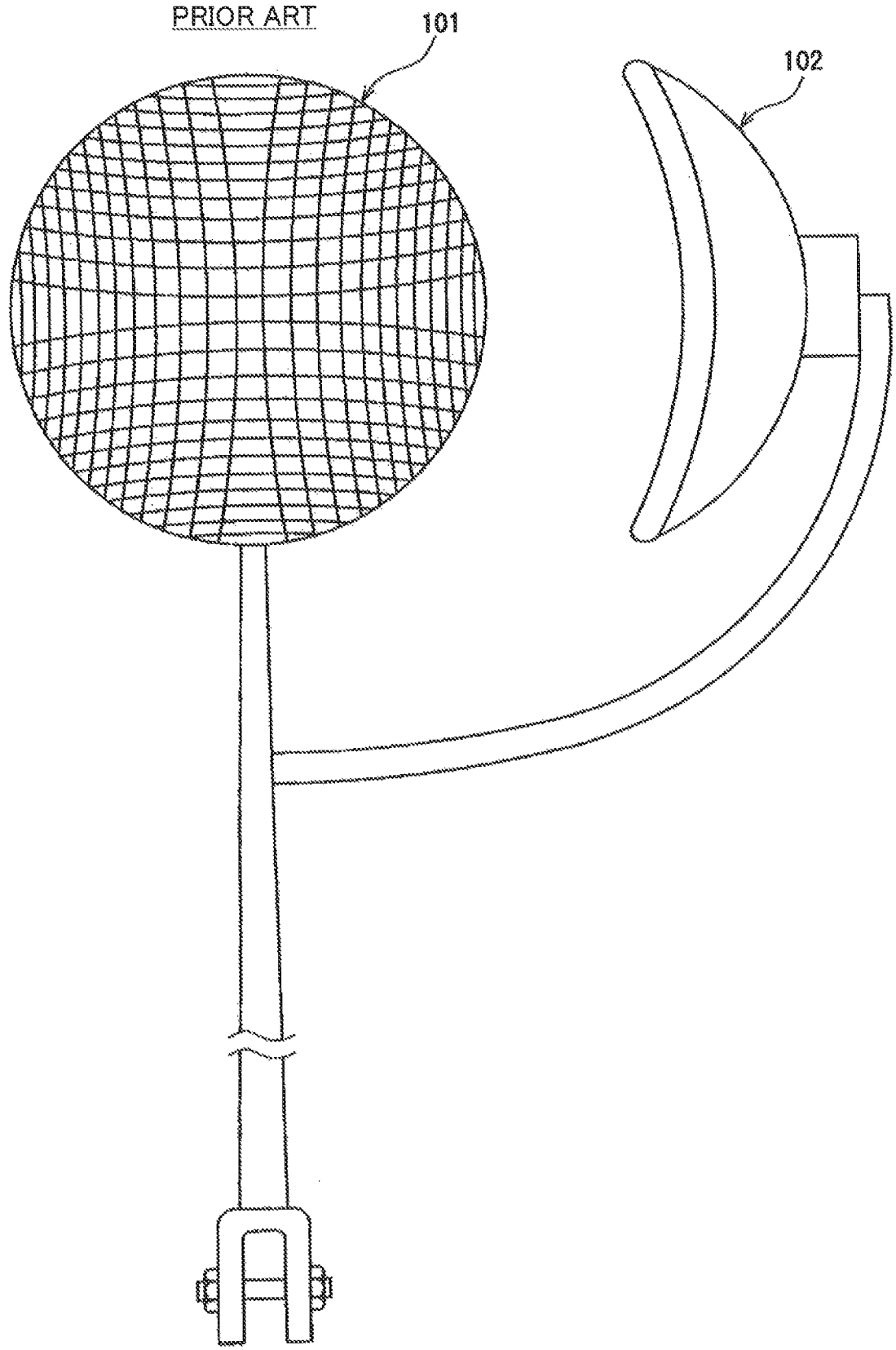
FIG. 7 is a side view illustrating a solar power generation apparatus in the related art.

FIG. 6 shows a solar power generation apparatus according to a sixth embodiment of the present invention, and the solar power generation apparatus includes a solar cell panel body 11, a curved mirror holder 62 holding a curved mirror 2, a Fresnel lens 6, a lens frame 61, a base 3, a swivel base 66, a strut 64, a sun position detecting means (not shown), a swivel base driving means (not shown), an arm rotation driving means (not shown), and a lens frame rotation driving means (not shown).

A periphery of the Fresnel lens 6 is held by the lens frame 61. A side surface central portion 67 of the lens frame 61 is installed at an arm 60, and the lens frame can be rotated around a shaft 67*a* which is parallel to the base 3 by the lens frame rotation driving means. The arm 60 perpendicularly extends from a side surface central portion of the curved mirror holder 62 and is installed at a shaft supporter 64*a* of a rotation shaft 18 so as to be rotated around the rotation shaft 18 by the arm rotation driving means. The strut 64 is vertically erected from the swivel base 66. The rotation plate 66 which is in a disk shape is installed on the base 3 and can be rotated in a circumferential direction by the swivel base driving means.

The swivel base driving means acquires an azimuth signal of the sun from the sun position detecting means and rotates the rotation plate 66 such that the solar cell panel body 11 faces the sun. The arm rotation driving means and the lens frame rotation driving means acquire an altitude signal of the sun from the sun position detecting means. The arm rotation driving means rotates the arm 60 such that a reflection surface 12 faces the sun, and the lens frame rotation driving means rotates the lens frame 61 so as to adjust an incidence angle of the sunlight to the Fresnel lens 6.

In the solar power generation apparatus according to the sixth embodiment, since the sunlight is collected at the solar cell panel body 11 using the Fresnel lens 6, power generation efficiency in a condensing range is increased, and power generation is efficiently performed even with a small area.

In addition, since the swivel base 66, the arm 60, and the lens frame 61 can be rotated depending on an azimuth and altitude of the sun detected by the sun position detecting means, the solar cell panel body 11 and the reflection surface 12 can face the sun at all times, and thereby power generation efficiency is improved. Further, by rotating the solar cell panel body 11, it is possible to prevent burn-out occurring because the sunlight collected by the Fresnel lens 6 is applied only to some of the solar cell panels 1.

Figure 8:
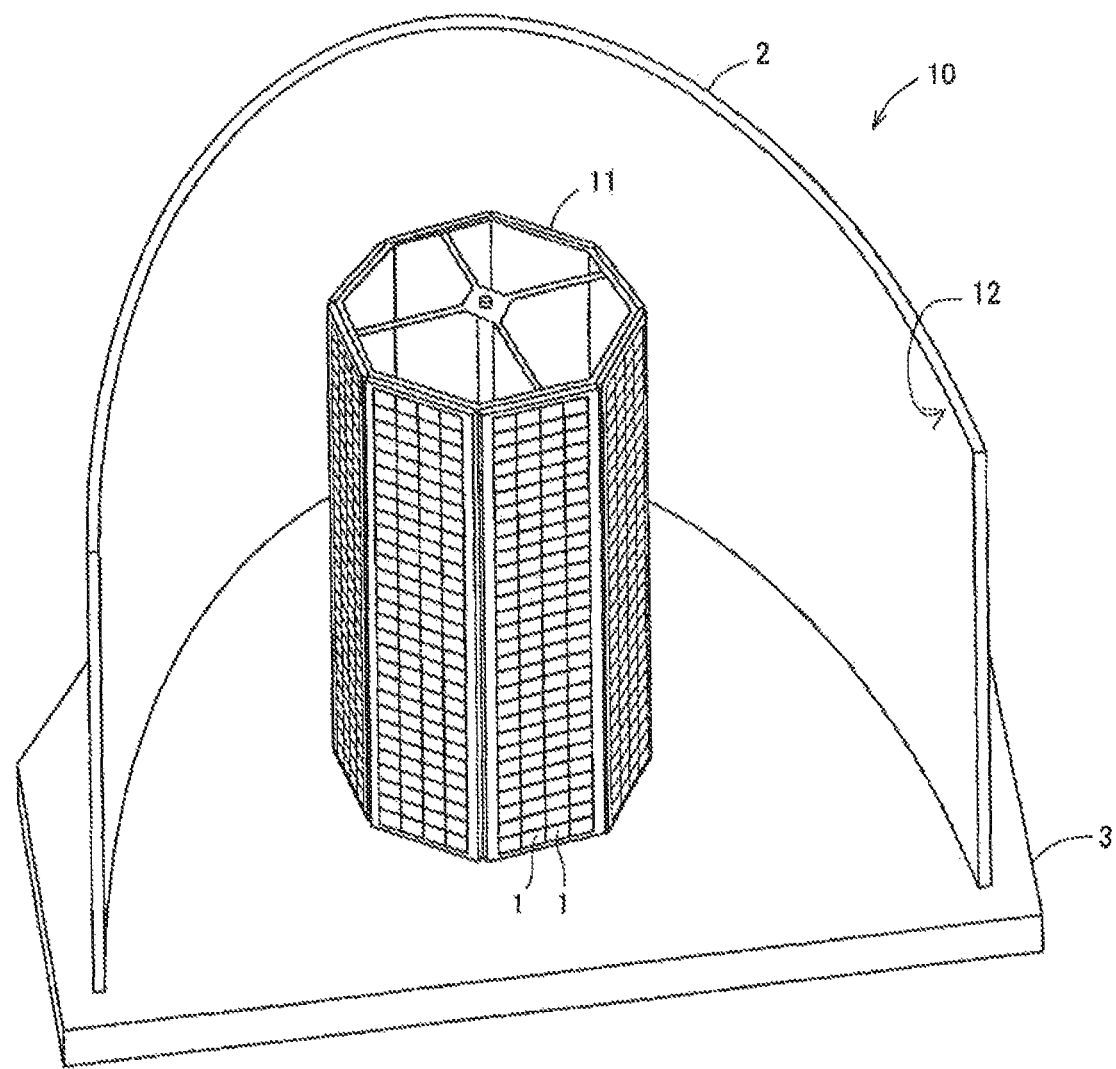
FIG. 8 is a perspective view illustrating a solar power generation apparatus according to a seventh embodiment of the present invention.

FIG. 8 shows a solar power generation apparatus 10 according to a seventh embodiment of the present invention, and the solar power generation apparatus 10 includes solar cell panels 1, a curved mirror 2 which is a reflection plate, and a base 3.

In the present embodiment as well, a solar cell panel body 11 is obtained by disposing the solar cell panels 1 in an octagonal prism shape. The solar cell panel body 11 may be obtained by disposing the solar cell panels 1 in a polygonal prism shape or a cylindrical shape other than the octagonal prism shape.

A shape of the curved mirror 2 is a semi-tube shape which reflects the sunlight at a reflection surface 12, and the reflection surface 12 is formed to be concaved. Thereby, the inside of the reflection surface 12 is in a groove shape which extends in an axial direction of the tube. The reflection surface 12 may be a specular reflective surface. In addition, the reflection surface 12 may be a diffuse reflective surface.

A transverse cross-section of the reflection surface 12 has any curved shape, and may have a parabolic shape, an elliptical shape, or any polygonal line shape (hyperbolic shape, or combination of straight lines) other than the parabolic shape. The reflection plate may be constituted by arranging plural small-sized mirrors. The curved mirror 2 is a glass mirror, but may be an acryl mirror, an aluminum mirror or a stainless steel mirror, and preferably has high reflectance.

The curved mirror 2 has a shape where a tube is divided into approximately two parts in an axial direction, and is erected on the base 3 in the vertical direction which is the axial direction thereof. In addition, the solar cell panel body 11 is fixed to the base 3 and is erected in a manner that its axial direction may be the vertical direction.

In the present invention, the vertical direction is a direction visually confirmed as a vertical direction to the horizontal surface and is a direction of a rising angle of 45 degrees or more with respect to the horizontal surface. A horizontal direction is a direction perpendicular to the vertical direction.

Figure 9:
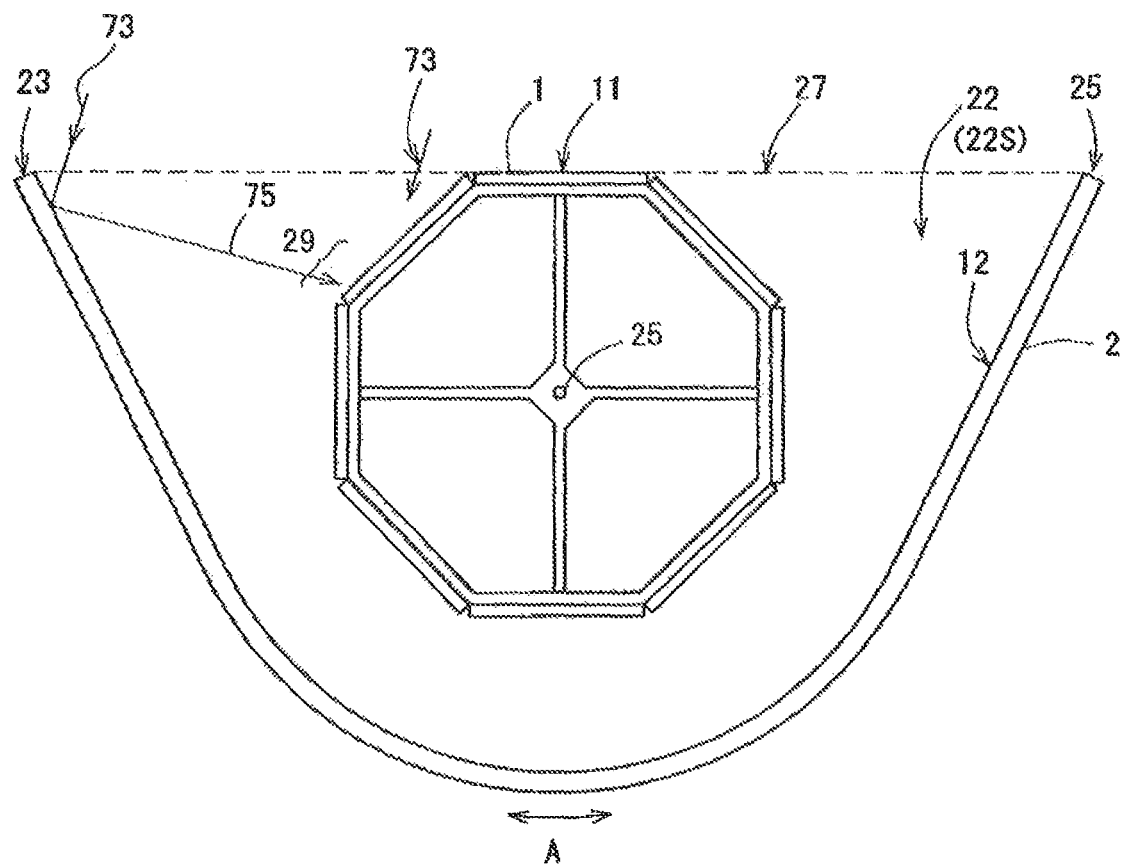
FIG. 9 is a diagram illustrating the solar power generation apparatus according to the seventh embodiment of the present invention.

In the solar power generation apparatus according to the seventh embodiment, as shown in the arrangement view (top view) of FIG. 9, 80% or more of the light receiving surfaces of the solar cell panel body 11, that is, the light receiving surfaces of the solar cell panels are located in a space 22 with a groove shape formed inside the curved mirror 2. That is to say, 80% or more of the light receiving surfaces of the solar cell panel body 11 are located in an inner space 22S between a virtual plane 27 over two sides 23 and 25 parallel to the axial direction of the curved mirror 2 and the reflection surface 12.

With this configuration, the sunlight is directly incident to the solar cell panel body 11 and 50% or more of the light receiving surfaces of the solar cell panel body 11 receive light reflected from the curved mirror 2. Therefore, a power generation amount is increased, and thus it is possible to perform efficient power generation. In addition, there are many solar cell panels which directly receive the sunlight and receive light reflected from the curved mirror 2, thereby contributing to improvement of power generation efficiency. For example, a region 29 of the solar cell panel body 11 to which sunlight 73 is directly incident is irradiated with reflected light 75.

If a ratio of the light receiving surfaces located in the inner space 22S of the light receiving surfaces of the solar cell panel body 11 is less than 80%, there are few solar cell panels which directly receive the sunlight and receive light reflected from the curved mirror 2, and favorable power generation efficiency cannot be obtained.

In addition, in the seventh embodiment, the solar cell panels 1 are disposed in a tube shape, and thus it is possible to reduce the installation area of the solar cell panels 1.

In the solar power generation apparatus according to the seventh embodiment of the present invention, in FIG. 9, the curved mirror 2 is rotated in a direction of an arrow A along an approximately circular trajectory having the shaft (tube shaft) of the solar cell panel body 11 as an axis 25. It is possible to adjust a direction of the reflection plate according to a horizontal azimuth of the sun through this rotation. Therefore, it is possible to perform solar power generation by directly receiving the sunlight and reflecting the sunlight more efficiently. Further, in the present specification, the same reference numerals through the drawings indicate the same or equivalent members.

Figure 10A:
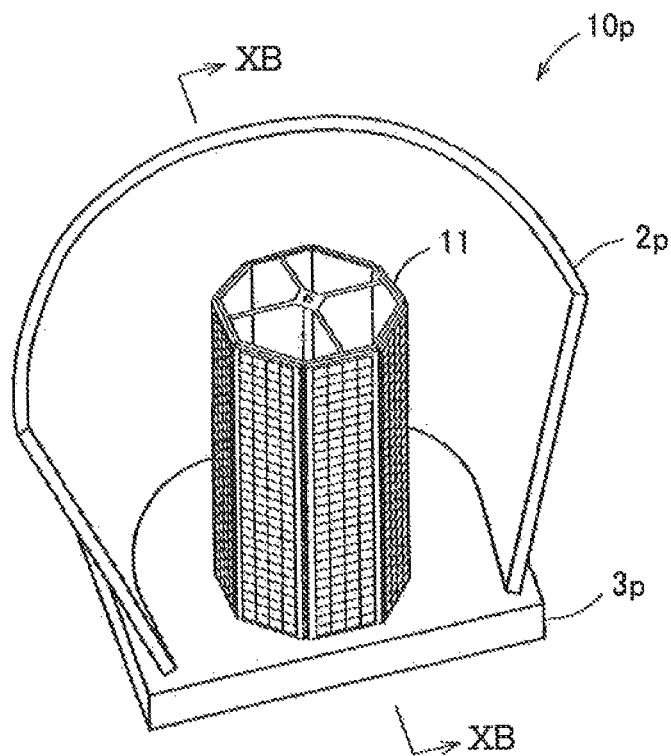
FIG. 10A is a perspective view illustrating an example of another aspect of the solar power generation apparatus according to the seventh embodiment of the present invention.
Figure 10B:
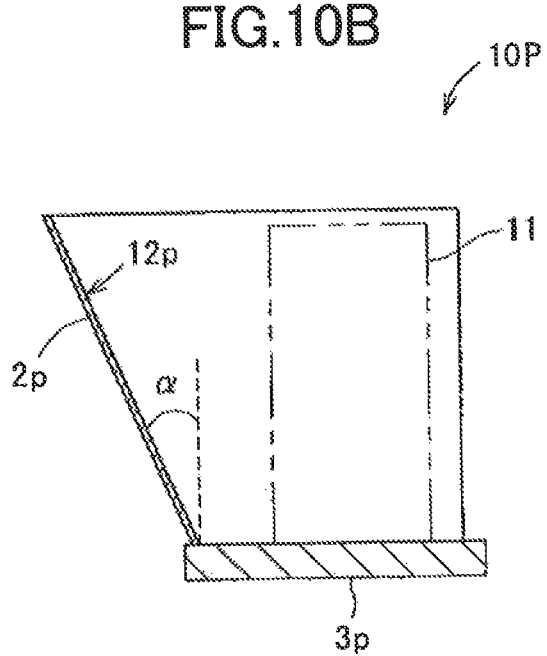
FIG. 10B is a cross-sectional view taken along a line XB-XB in FIG. 10A.

An example of another aspect of the seventh embodiment is shown in FIGS. 10A and 10B. In a solar power generation apparatus 10p shown in FIGS. 10A and 10B, a curved mirror 2p is used instead of the curved mirror 2 in the solar power generation apparatus 10 shown in FIG. 8. The curved mirror 2p has a shape where a tube having a circumferential surface shape of a circular truncated cone is divided into approximately two parts in an axial direction, and is erected on a base 3p in a manner that its axial direction may be the vertical direction. An angle α formed between the surface of the base 3p and a reflection surface 12p of the curved mirror 2p is 5 to 30 degrees. In this aspect, power generation efficiency is high when the sun is high.

In addition, in the present specification, the tube is defined to include a tubular object of which the thickness is different in the axial direction.

Figure 11A:
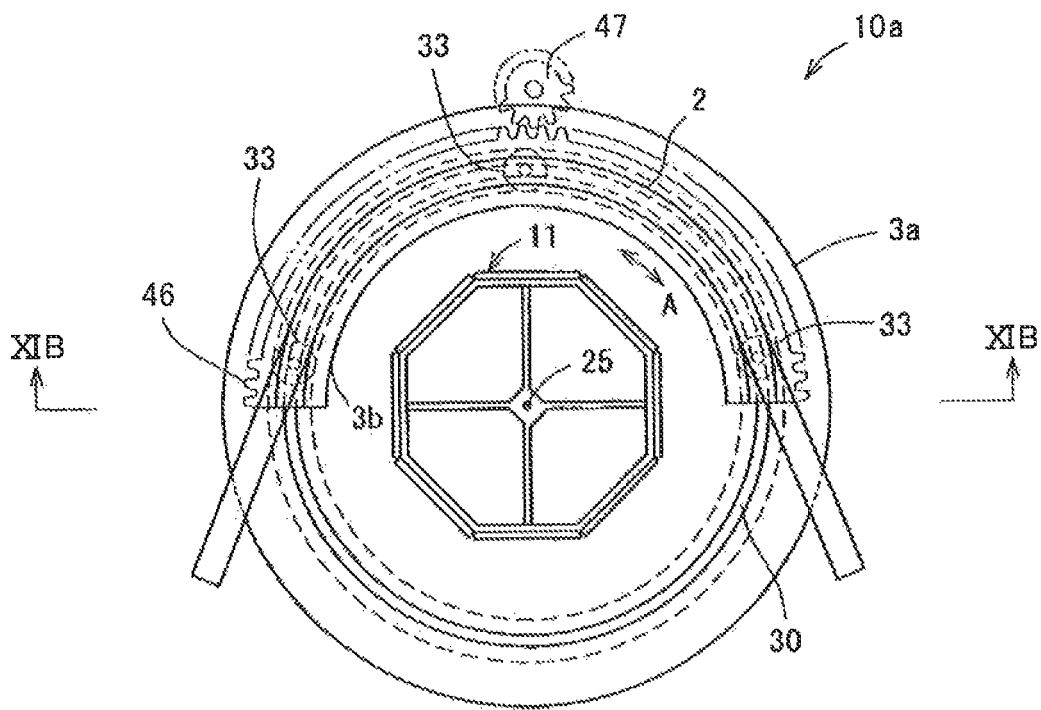
FIG. 11A is a plan view illustrating a solar power generation apparatus according to an eighth embodiment of the present invention.
Figure 11B:
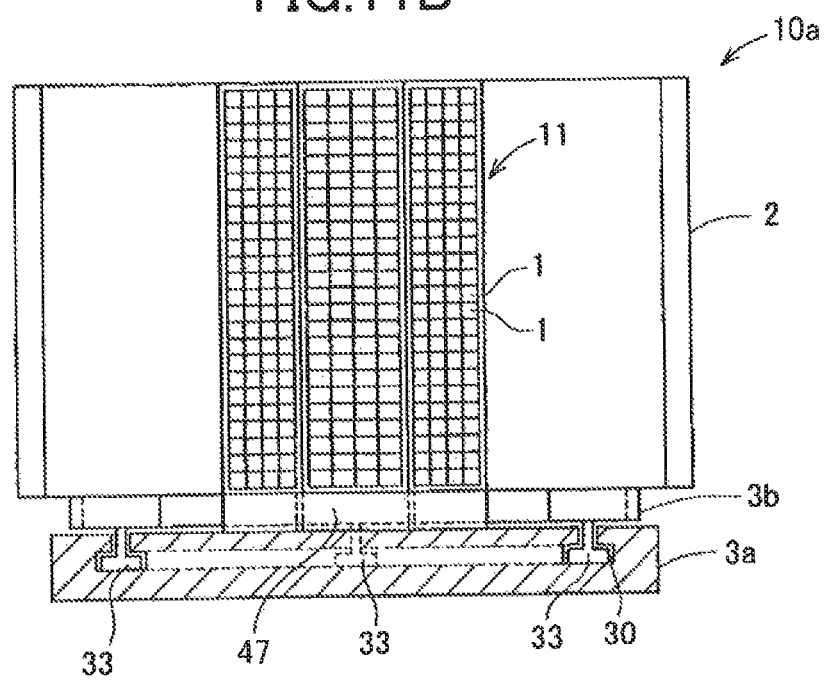
FIG. 11B is a front view (partial cross-sectional view) illustrating the solar power generation apparatus according to the eighth embodiment of the present invention.

An example of an aspect of a solar power generation apparatus according to an eighth embodiment is shown in FIGS. 11A and 11B. In FIGS. 11A and 11B, a solar power generation apparatus 10a includes a solar cell panel body 11, a curved mirror 2, a fixed base 3a, and a movable base 3b. The solar cell panel body 11 is fixed and erected on the fixed base 3a installed at the ground when an axis 25 (tube shaft) is in the vertical direction. The curved mirror 2 is erected on the movable base 3b which is semicircular when viewed from the upper surface.

The upper surface of the fixed base 3a is provided with a guide groove 30 which has the axis 25 as the center of the curvature and is semicircular when viewed from the upper surface. A cross-sectional shape of the guide groove 30 is a reverse T shape. A guide frame 33 is installed at the lower surface of the movable base 3b. The guide frame 33 is fitted to the guide groove 30, is guided to the guide groove 30, and can be moved in an arch trajectory in the horizontal direction. Thereby, the movable base 3b can be rotated in a direction of an arrow A, and the curved mirror 2 is rotated in the direction of the arrow A so as to be moved around the outside of the solar cell panel body 11 along an approximately circular trajectory having the shaft of the solar cell panel body 11 as the axis 25 in the same manner as the aspect shown in FIG. 9. A gear train 46 is formed on the outer circumference of the movable base 3b, and the gear train 46 is engaged with driving gears 47 which are rotatably driven by a rotating driving means (not shown). Thereby, the movable base 3b is driven so as to be rotated in the direction of the arrow A.

The rotating driving means may rotate the driving gears 47 manually or using a motor or the like, or may use some of power obtained through the solar power generation. The movable base 3b may be directly driven by the rotating driving means.

According to the solar power generation apparatus 10a, it is possible to uniformly adjust deterioration in the solar cell panels 1 by preventing the sunlight from being directly incident only to some of the solar cell panels 1 and it is possible to optimize a light reception amount by moving the curved mirror 2 according to the position of the sun.

As the motor used for the rotating driving means, a stepping motor or the like which can control a rotation angle is preferable. The driving means is preferably electrically connected to the sun position detecting means (not shown) so as to communicate with each other. In this case, the rotating driving means is operated in response to a signal output from the sun position detecting means. The operation may be performed using some of the power obtained through the solar power generation.

The sun position detecting means includes a photodiode as a sensor, detects the position (azimuth and altitude) of the sun, and outputs a signal indicating the position. When the position of the sun cannot be detected due to the cloudy weather, the position of the sun may be predicted using a predefined calculation formula, the date, and installation place information.

Figure 12A:
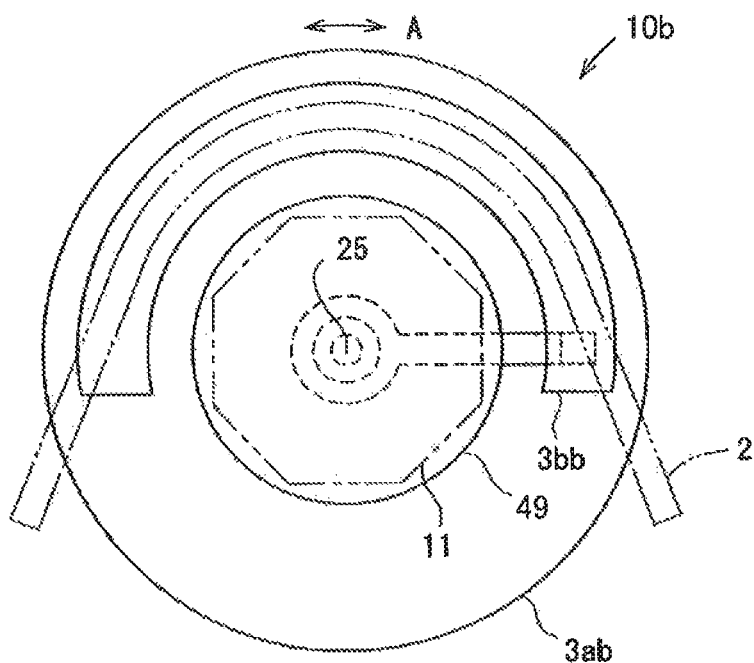
FIG. 12A is a plan view illustrating an example of another aspect of the solar power generation apparatus according to the eighth embodiment of the present invention.
Figure 12B:
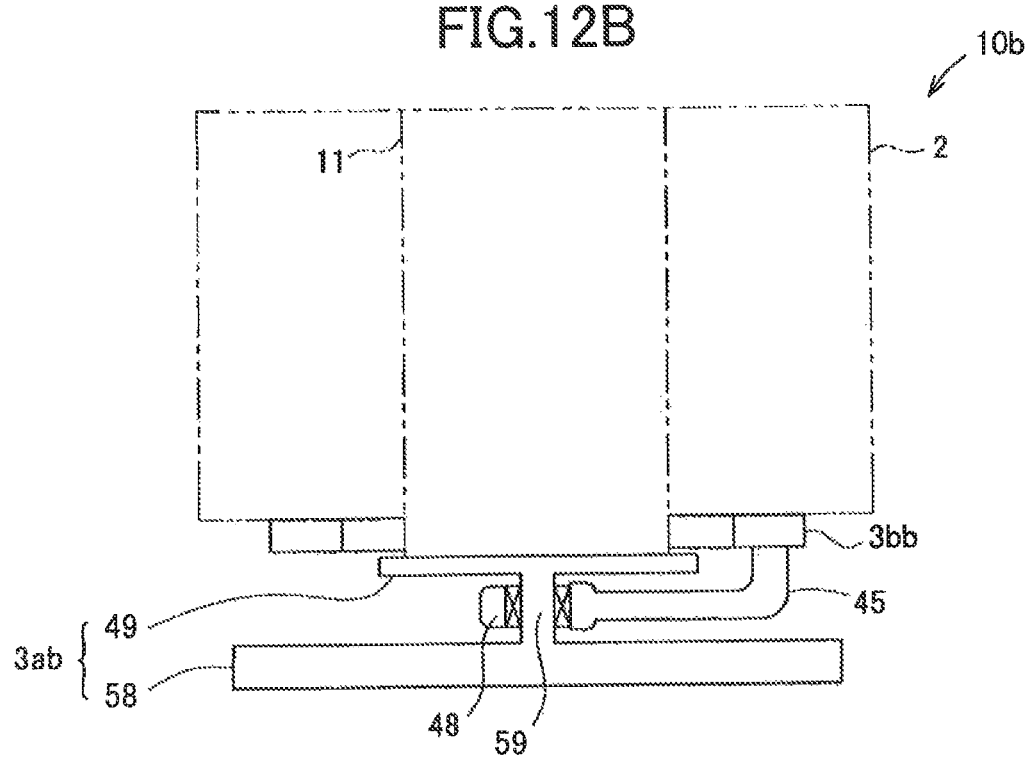
FIG. 12B is a front view illustrating an example of another aspect of the solar power generation apparatus according to the eighth embodiment of the present invention.

Another example of the aspect of the eighth embodiment is shown in FIGS. 12A and 12B. In FIGS. 12A and 12B, a solar power generation apparatus 10b includes a solar cell panel body 11, a curved mirror 2, a fixed base 3ab, and a movable base 3bb which is semicircular when viewed from the upper surface. The solar cell panel body 11 is fixed and erected on an upper base 49 which has a disc shape and is installed at the ground so as to be parallel thereto in the vertical direction which is a direction of an axis 25. The curved mirror 2 is erected on the movable base 3bb which is semicircular when viewed from the upper surface.

The fixed base 3ab includes the disc-shaped upper base 49 and a disc-shaped lower base 58. The upper base 49 and the lower base 58 share an axis of the two and are disposed so as to be parallel to each other with a gap, and are connected to each other via a round shaft 59 coaxial with the axis. On the other hand, the movable base 3bb is rotatably fitted to the round shaft 59 via a connection shaft 45 and a bearing 48, and can be rotated around the round shaft 59, that is, the axis 25. Thereby, the curved mirror 2 is rotated in a direction of an arrow A so as to be moved around the outside of the solar cell panel body 11 along an approximately circular trajectory having the shaft of the solar cell panel body 11 as the axis 25 in the same manner as the aspect shown in FIG. 9. The movable base 3bb is driven by a driving means (not shown).

Figure 13:
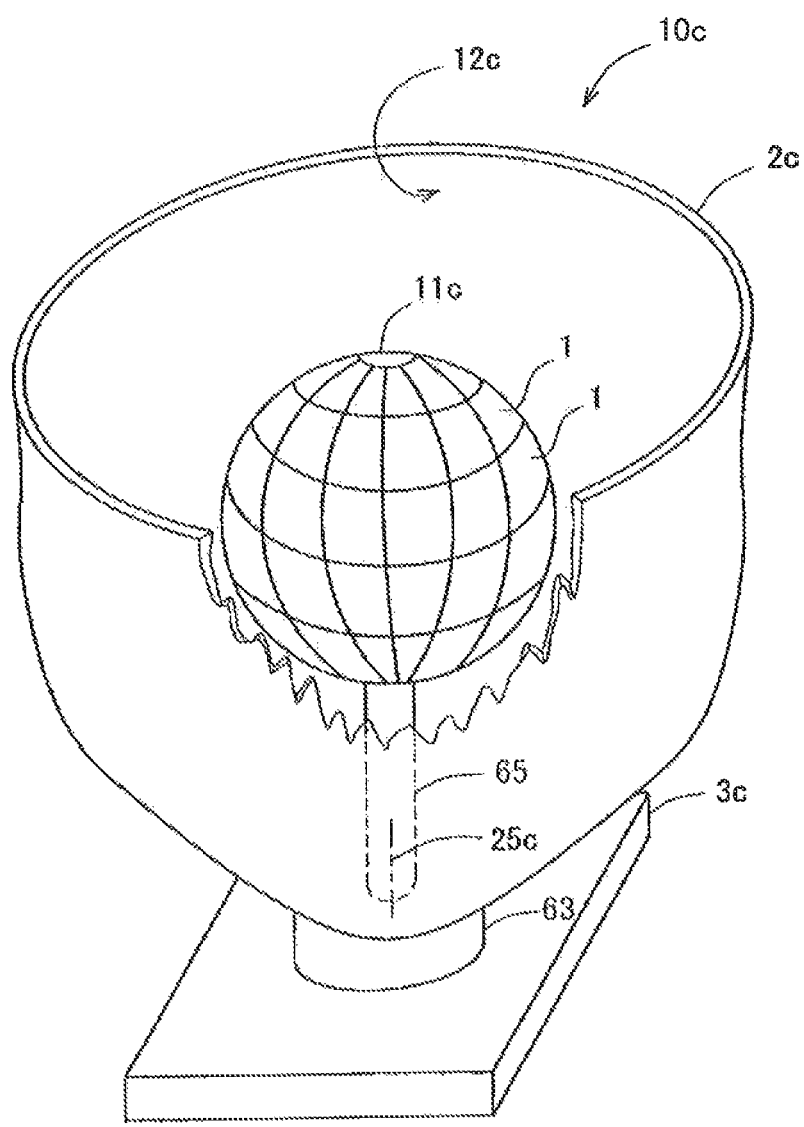
FIG. 13 is a perspective view illustrating a solar power generation apparatus according to a ninth embodiment of the present invention.

In a solar power generation apparatus according to a ninth embodiment of the present invention, in FIG. 13, a solar power generation apparatus 10c includes a solar cell panel body 11c, a curved mirror 2c, and a fixing base 3c which fixes the curved mirror 2c. The curved mirror 2c has a bowl shape which is open upwardly and has an inner surface as a reflection surface 12c, and is fixed on the fixing base 3c installed at the ground via a pedestal 63 in the vertical direction which is a direction of an axis 25c. The solar cell panel body 11c is fixed above the bottom of the curved mirror 2c via a fixing member 65.

The bowl shape is a shape of one side when a convex closed surface is cut in round slices outwardly.

A longitudinal cross-section of the curved mirror 2c has any curved shape, and may have a parabolic shape, an elliptical shape, or any polygonal line shape (hyperbolic shape, or combination of straight lines) other than them. The reflection plate may be constituted by arranging plural small-sized mirrors.

An open surface or a transverse cross-section of the curved mirror 2c is preferably circular. A polygonal shape may be employed.

The solar cell panel body 11c is obtained by disposing solar cell panels 1 in an approximately spherical shell shape. The solar cell panel body 11c may be obtained by disposing the solar cell panels 1 in a polyhedral shell shape or in an approximately spheroidal shell shape.

In addition, the spheroid is a solid occurring when a single elliptical plane is rotated with respect to an axis of rotation existing therein, but, in the present invention, the sphere or the spheroid is not necessarily an exact shape geometrically, and the approximately spherical shell shape or the approximately spheroidal shell shape refers to one which can be recognized as a spherical shell shape or a spheroidal shell shape visually, and a close surface shape which is inscribed or circumscribed around a polyhedral shell.

Figure 14A:
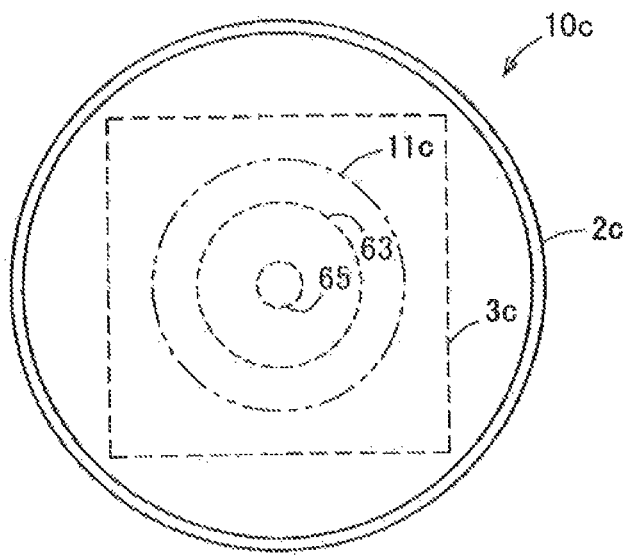
FIG. 14A is a plan view illustrating the solar power generation apparatus according to the ninth embodiment of the present invention, shown in FIG. 13.
Figure 14B:
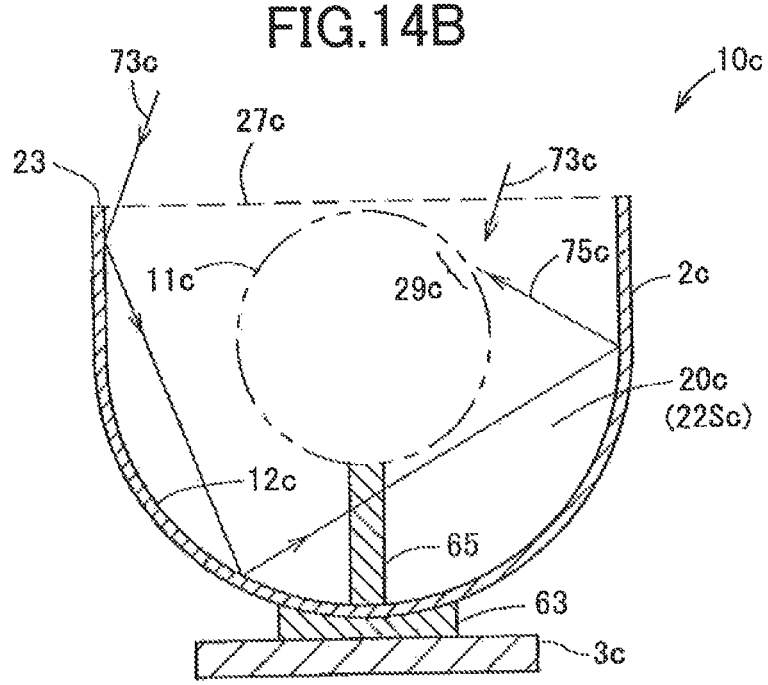
FIG. 14B is a front view (partial cross-sectional view) illustrating the solar power generation apparatus according to the ninth embodiment of the present invention, shown in FIG. 13.

In the solar power generation apparatus according to the ninth embodiment, as shown in the arrangement views of FIGS. 14A and 14B, 80% or more of the light receiving surfaces of the solar cell panel body 11c, that is, the light receiving surfaces of the solar cell panels are located in an inner space 22c of a hollow-shaped space (hollow 20c) formed inside the curved mirror 2c. That is to say, 80% or more of the light receiving surfaces of the solar cell panel body 11c are located in an inner space 22Sc between a virtual plane 27c including an upper side 23 of the curved mirror 2c moved in the horizontal direction and the reflection surface 12c.

With this configuration, since 50% or more of the light receiving surfaces of the solar cell panel body 11c receive light reflected from the curved mirror 2c, a power generation amount is increased, and thus it is possible to perform efficient power generation. In addition, since the solar cell panels 1 are disposed in an approximately spherical shell shape, in a polyhedral shell shape, or in an approximately spheroidal shell shape, there are many solar cell panels which directly receive the sunlight and receive light reflected from the curved mirror 2c, thereby contributing to improvement of power generation efficiency. For example, a region 29c of the solar cell panel body 11c to which sunlight 73c is directly incident is irradiated with reflected light 75c.

If a ratio of the light receiving surfaces located in the inner space 22c of the light receiving surfaces of the solar cell panel body 11c is less than 80%, there are few solar cell panels which directly receive the sunlight and receive light reflected from the curved mirror 2c, and favorable power generation efficiency cannot be obtained.

Figure 15:
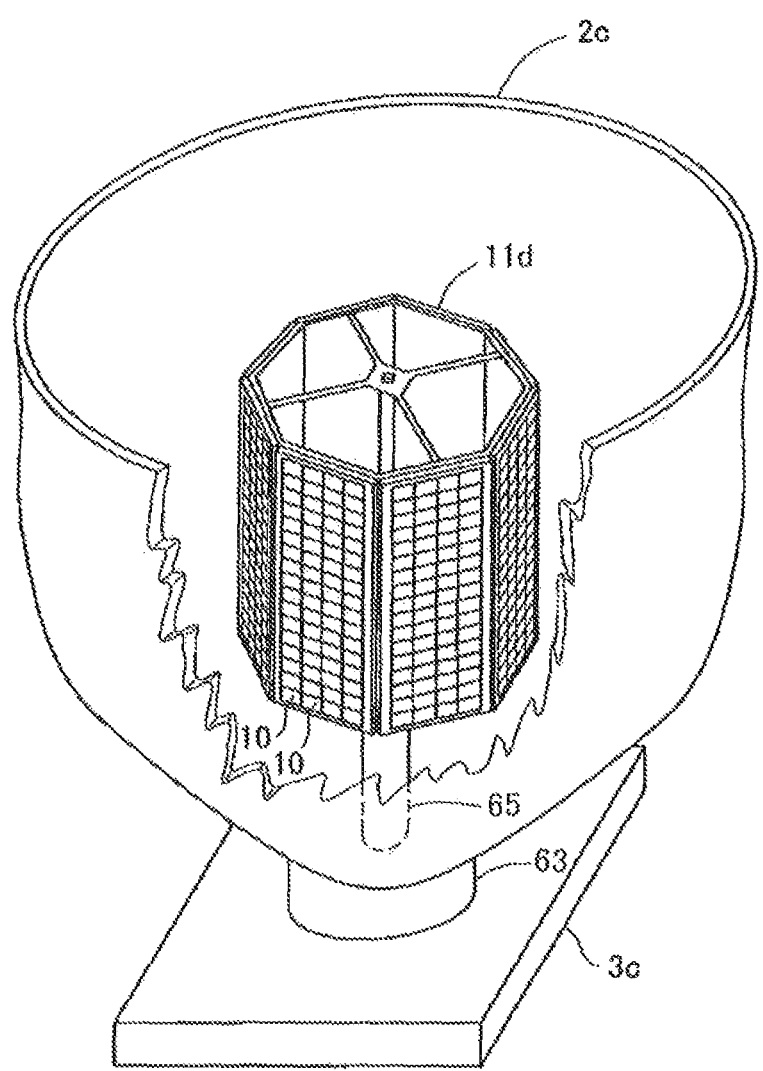
FIG. 15 is a perspective view illustrating a solar power generation apparatus according to a tenth embodiment of the present invention.

FIG. 15 shows an aspect of another example of the solar power generation apparatus according to the ninth embodiment. In FIG. 15, a solar cell panel body 11d where solar cell panels 1 are disposed in a cylindrical shape is used instead of the solar cell panel body 11c in the aspect of FIG. 13. In the aspect as well, it is possible to perform efficient power generation.

In addition, the present invention may be implemented with aspects to which various alterations, corrections, or modifications are added according to the knowledge of a person skilled in the art within the scope without departing from the spirit thereof. Further, the present invention may be implemented in a form where an invention specifying matter is replaced with another technique within the scope achieving the same operation or effect.

What is claimed is:
1. A solar power generation apparatus comprising:
   a tube-shaped solar cell panel body that comprises a plurality of solar cell panels, pairs of said solar cell panels being coupled side-by-side and together forming an external surface of the tube shape solar cell panel body, the tube shape solar cell panel body having a center longitudinal axis about which the plurality of solar cell panels are disposed;
   a reflection plate having a concave and curved reflection surface, said reflecting plate being disposed away from a portion of the external surface of the solar panel body in a radial direction from the center longitudinal axis such that light incident on the reflection plate is reflected onto the solar cell panels;

a pair of struts which rotatably supports the tube-shaped solar cell panel body about the center longitudinal axis of the axis of the tube shape solar cell panel body, a rotation driving means for rotating the tube shape solar cell panel body about the center longitudinal axis, the tube shape solar cell panel body being rotatable separately from the reflection plate;

a base having a surface on which the strut is erected, wherein the center longitudinal axis is positioned in parallel with the surface of the base, and wherein the reflection surface is parallel with the center longitudinal axis in a plane which contains the center longitudinal axis and faces the solar cell panels.

2. A solar power generation apparatus according to claim 1, wherein the rotation driving means is selected from the group consisting of a handle, a motor and an impeller.

3. A solar power generation apparatus according to claim 2, wherein the rotation driving means uses power generated by the solar cell panels.

4. A solar power generation apparatus according to claim 1, wherein the solar cell panel body comprises solar cell panels disposed in a polygonal prism shape.

5. A solar power generation apparatus according to claim 1, wherein the solar cell panel body comprises solar cell panels disposed in a cylindrical shape.

* * * * *